US009992895B2

(12) United States Patent
Chuang et al.

(10) Patent No.: US 9,992,895 B2
(45) Date of Patent: Jun. 5, 2018

(54) METHODS FOR ASSEMBLING AN ELECTRONIC APPARATUS

(71) Applicant: HTC Corporation, Taoyuan (TW)

(72) Inventors: I-Cheng Chuang, Taoyuan County (TW); Yu-Jing Liao, Taoyuan County (TW); Ying-Yen Cheng, Taoyuan County (TW); Yin-Chou Chen, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 436 days.

(21) Appl. No.: 14/804,351

(22) Filed: Jul. 21, 2015

(65) Prior Publication Data
US 2015/0327413 A1 Nov. 12, 2015

Related U.S. Application Data

(62) Division of application No. 13/629,625, filed on Sep. 28, 2012, now Pat. No. 9,137,918.

(51) Int. Cl.
*H05K 3/30* (2006.01)
*H05K 7/06* (2006.01)
(Continued)

(52) U.S. Cl.
CPC ............ *H05K 7/06* (2013.01); *G06F 1/1626* (2013.01); *H04M 1/0202* (2013.01);
(Continued)

(58) Field of Classification Search
CPC ... H05K 7/06; H05K 13/0023; H04M 1/0277; H04M 1/0262; H04M 1/0202;
(Continued)

(56) References Cited

U.S. PATENT DOCUMENTS 6,388,870 B1    5/2002  Canova, Jr. et al.
6,920,344 B2 *  7/2005  Jang ..................... H01Q 1/245
                                                          361/752
(Continued)

FOREIGN PATENT DOCUMENTS

CN      101080876      11/2007
CN      102544887       7/2012

OTHER PUBLICATIONS

"Office Action of U.S. Related Application", dated Sep. 11, 2015, p. 1-p. 36.
(Continued)

*Primary Examiner* — Donghai D Nguyen
(74) *Attorney, Agent, or Firm* — JCIPRNET

(57) ABSTRACT

An electronic apparatus including a housing, a motherboard, a battery and a display module is provided. The housing has at least an opening and an accommodating space. The motherboard is disposed in the accommodating space. The battery is disposed in the accommodating space and stacked over the motherboard. The motherboard is located between the housing and the battery. The display module is disposed in the accommodating space and stacked over the battery. The battery is located between the motherboard and the display module. At least one edge of the battery in a width direction of the battery is closer to a corresponding side of the housing than a corresponding edge of the motherboard in a width direction of the motherboard.

18 Claims, 4 Drawing Sheets

(51) Int. Cl.
*G06F 1/16* (2006.01)
*H04M 1/02* (2006.01)
*H05K 13/00* (2006.01)

(52) U.S. Cl.
CPC ....... *H04M 1/0262* (2013.01); *H04M 1/0277* (2013.01); *H05K 13/0023* (2013.01); *H04M 1/0266* (2013.01); *Y10T 29/49124* (2015.01); *Y10T 29/49126* (2015.01); *Y10T 29/49128* (2015.01)

(58) Field of Classification Search
CPC . H04M 1/0249; H04M 1/0266; G06F 1/1626; H04B 1/3838; Y10T 29/49128; Y10T 29/49126; Y10T 29/49124
USPC ............ 29/830, 831, 832; 343/702; 361/752
See application file for complete search history.

(56) References Cited

U.S. PATENT DOCUMENTS

| | | | |
|---|---|---|---|
| 7,068,979 B2 | 6/2006 | Pedersen et al. | |
| 7,336,228 B2 * | 2/2008 | Lu | H04B 1/3838 343/702 |
| 7,369,674 B2 | 5/2008 | Miura | |
| 8,009,850 B2 | 8/2011 | Zhou et al. | |
| 8,467,195 B2 | 6/2013 | Zaitsu | |
| 8,483,785 B2 | 7/2013 | Yahagi et al. | |
| 8,537,543 B2 * | 9/2013 | Wang | H04M 1/0249 455/575.1 |
| 8,629,952 B2 | 1/2014 | Sugimori et al. | |
| 8,634,184 B2 | 1/2014 | Kim et al. | |
| 8,634,885 B2 | 1/2014 | Chang et al. | |
| 8,693,712 B2 | 4/2014 | Sun et al. | |
| 8,880,129 B2 | 11/2014 | Lee et al. | |
| 8,885,333 B2 | 11/2014 | Lim et al. | |
| 8,947,865 B2 | 2/2015 | Matsuda et al. | |
| 2006/0233356 A1 | 10/2006 | Lu et al. | |
| 2008/0019502 A1 | 1/2008 | Emmert et al. | |
| 2008/0176603 A1 | 7/2008 | Yu | |
| 2009/0015565 A1 | 1/2009 | Hong et al. | |
| 2009/0175018 A1 | 7/2009 | Zaitsu | |
| 2009/0257189 A1 | 10/2009 | Wang et al. | |
| 2010/0091439 A1 | 4/2010 | Horii | |
| 2010/0105452 A1 | 4/2010 | Shin et al. | |
| 2010/0258626 A1 | 10/2010 | Watanabe et al. | |
| 2010/0273537 A1 | 10/2010 | Jiang | |
| 2011/0021255 A1 | 1/2011 | Kim et al. | |
| 2011/0077063 A1 | 3/2011 | Yabe et al. | |
| 2011/0199721 A1 | 8/2011 | Allen et al. | |
| 2011/0237314 A1 | 9/2011 | Kajiwara et al. | |
| 2011/0261510 A1 | 10/2011 | Liu | |
| 2012/0115551 A1 | 5/2012 | Cho et al. | |
| 2013/0070947 A1 | 3/2013 | Chien et al. | |

OTHER PUBLICATIONS

"Office Action of U.S. Related Application", dated Sep. 16, 2015, p. 1-p. 21.
"Office Action of China Counterpart Application", dated Oct. 9, 2015, p. 1-p. 8.
"Notice of Allowance of Related U.S. Appl. No. 14/080,801," dated Jan. 13, 2016, p. 1-p. 31.

* cited by examiner

METHODS FOR ASSEMBLING AN ELECTRONIC APPARATUS

CROSS-REFERENCE TO RELATED APPLICATION

This application is a divisional application of and claims the priority benefit of U.S. Pat. No. 9,137,918, filed on Sep. 28, 2012. The entirety of the above-mentioned patent application is hereby incorporated by reference herein and made a part of this specification.

FIELD OF THE INVENTION

The application relates to an electronic apparatus and a method for assembling the same.

DESCRIPTION OF RELATED ART

In recent years, as the technology advances, handheld devices such as mobile phones, tablet computers are more commonly used and are developed to be more convenient, multi-functional and exquisite. More and more choices like the aforementioned are provided for consumers to choose from. Users have higher demands toward the handheld devices day by day. As the time prolongs for users to hold handheld devices by hands, the feeling in holding handheld devices are getting more important.

In order to enhance the feeling in holding handheld devices, a housing surface of handheld electronic devices are often designed to have a curved surface to conform designs of ergonomics. However, according to the current stacking method of interior space of handheld devices, a battery is closer to a housing of a handheld device than a motherboard, and therefore such handheld device cannot present a smooth arc shape due to the battery disposition.

SUMMARY OF THE INVENTION

The application is directed to an electronic apparatus with a smooth and curved surface of a housing.

The application is directed to a method for assembling an electronic apparatus for assembling components in a housing.

The application provides an electronic apparatus including a housing, a motherboard, a battery and a display module. The housing has at least an opening and an accommodating space. The motherboard is disposed in the accommodating space. The battery is disposed in the accommodating space and stacked over the motherboard. The motherboard is located between the housing and the battery. The display module is disposed in the accommodating space and stacked over the battery. The battery is located between the motherboard and the display module. At least one edge of the battery in a width direction of the battery is closer to a corresponding side of the housing than a corresponding edge of the motherboard in a width direction of the motherboard.

The application provides a method for assembling an electronic apparatus. A housing, a motherboard, a battery and a display module are provided, wherein the housing has at least an opening and an accommodating space, and the battery has assembled to the display module. The motherboard is stacked to one side of the battery, wherein the battery is located between the housing and the motherboard. The display module and the battery are electrically coupled to the motherboard. An assembling operation is performed to dispose an assembly of the motherboard, the battery and the display module in the accommodating space of the housing, such that the motherboard and the battery are located between the housing and the display module.

In light of the foregoing, in the application, an appearance of a housing of an electronic apparatus can be presented as a smooth and curved surface to effectively utilize a space inside the housing and increase a capacity of a battery. In addition, the method for assembling an electronic apparatus can assemble components inside a housing to effectively utilize a space inside the housing and increase a capacity of a battery.

In order to make the aforementioned features and advantages of the application more comprehensible, embodiments accompanying figures are described in details below.

DESCRIPTION OF EMBODIMENTS

Figure 1:
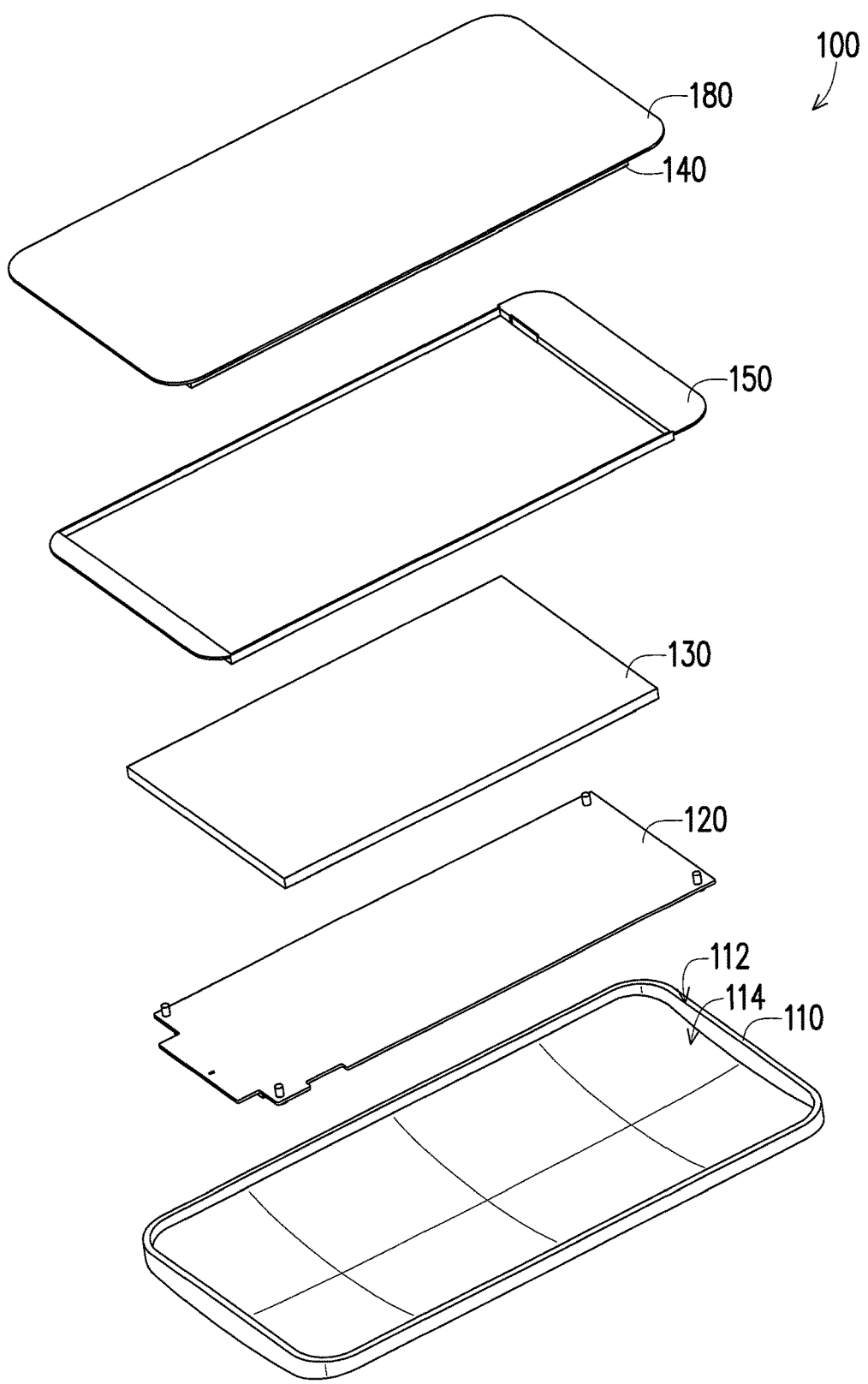
FIG. 1 is an exploded view of an electronic apparatus according to an embodiment of the application.
Figure 2:
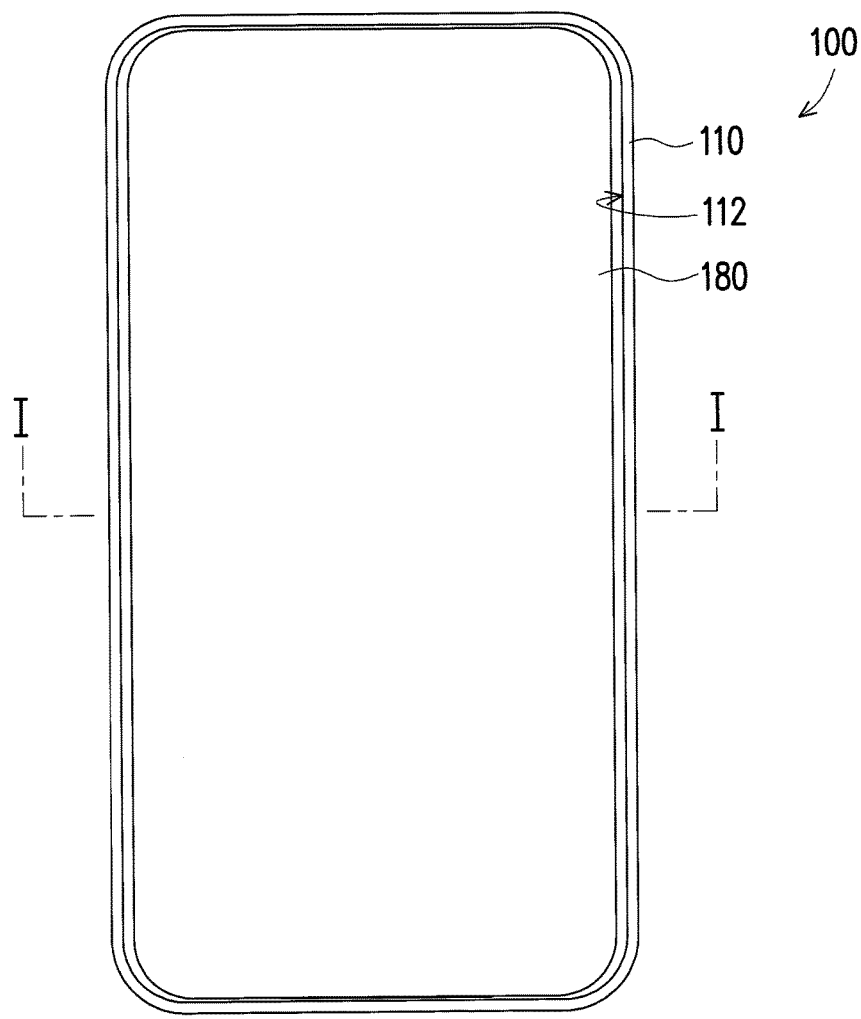
FIG. 2 is a front view of an assembled electronic apparatus of FIG. 1.
Figure 3:
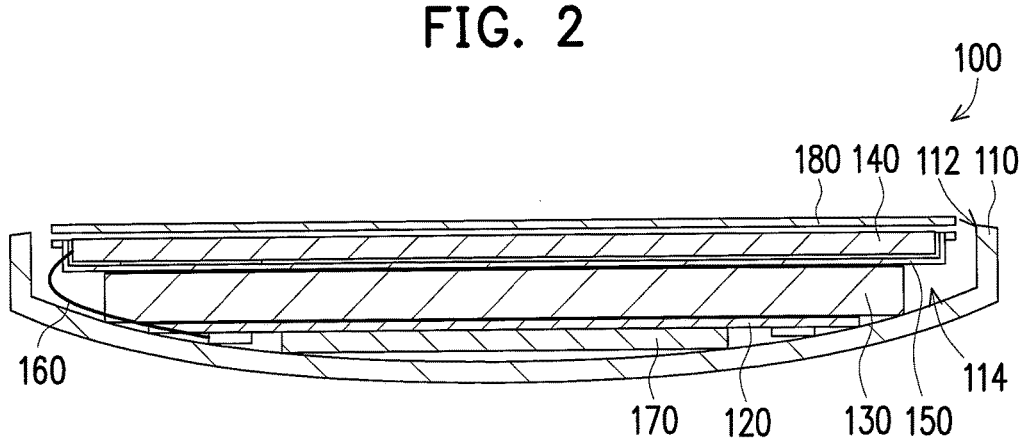
FIG. 3 is an enlarged cross-sectional view of the electronic apparatus along the line I-I of FIG. 2.

FIG. 1 is an exploded view of an electronic apparatus according to an embodiment of the application. FIG. 2 is a front view of an assembled electronic apparatus of FIG. 1. FIG. 3 is an enlarged cross-sectional view of the electronic apparatus along the line I-I of FIG. 2. Referring to FIG. 1 to FIG. 3. In the present embodiment, an electronic apparatus 100 includes a housing 110, a motherboard 120, a battery 130 and a display module 140.

The housing 110 has at least an opening 112 and an accommodating space 114. The motherboard 120 is disposed in the accommodating space 114, wherein the motherboard 120 includes a rigid circuit board and a plurality of electronic components mounted on the rigid circuit board. The battery 130 is disposed in the accommodating space 114 and stacked over the motherboard 120, wherein the motherboard 120 is located between the housing 110 and the battery 130. The display module 140 is disposed in the accommodating space 114 and stacked over the battery 130, wherein the battery 130 is located between the motherboard 120 and the display module 140. The display module 140 can have either a plug-in or build-in touch module.

In the present embodiment, a width of the motherboard 120 is narrower than a width of the battery 130, and the width of the battery 130 is narrower that a width of the display module 140. Accordingly, an appearance of the housing 110 can be presented as a smooth arc shape. Meanwhile, the width of the battery 130 is widened when the battery 130 is moved to a location between the motherboard 120 and the display module 140. As a result, with the same length and thickness, the width of the batter module 130 is widened to increase a capacity of the battery 130.

It should be noted that any width of any member disclosed in the application is a width in a horizontal direction of the member illustrated in FIG. 2 or FIG. 3.

Figure 4:
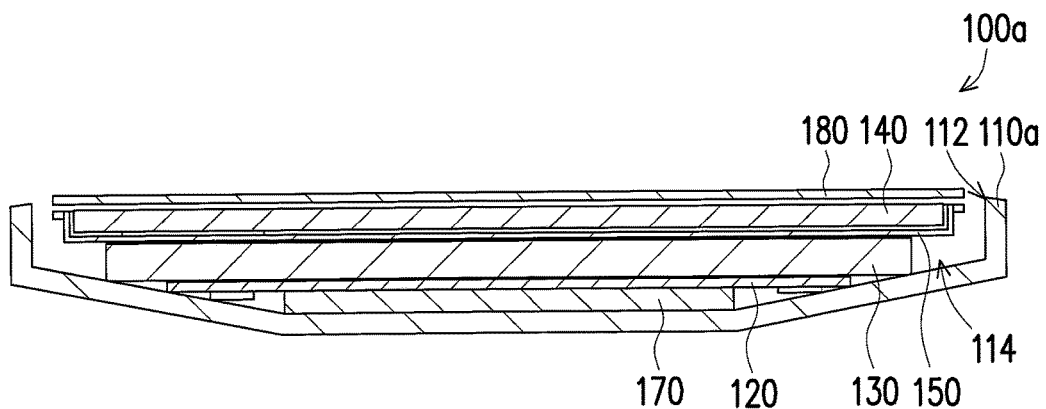
FIG. 4 is an enlarged cross-sectional view of an electronic apparatus according to another embodiment of the application.

Referring to FIG. 3 again. In the present embodiment, the housing 110 can extend along a curved surface, and edges of the motherboard 120 and edges of the battery 130 lean against the housing 110. In another embodiment illustrating an electronic apparatus 100a, as shown in FIG. 4, a housing 110a can extend along an inclined plane.

Referring to FIG. 1 and FIG. 3 again. In the present embodiment, the electronic apparatus 100 further includes a frame 150 wherein the frame 150 is disposed between the battery 130 and the display module 140 to secure a relative position between the battery 130 and the display module 140.

Referring to FIG. 3 again. In the present embodiment, the electronic apparatus 100 further includes a flexible printed circuit board 160 that connects the motherboard 120 and the display module 140. Specifically, the flexible printed circuit board 160 bypasses the battery 130 and connects the motherboard 120 and the display module 140.

Referring to FIG. 3 again. In the present embodiment, the electronic apparatus 100 further includes a shielding member 170 disposed in the accommodating space 114, wherein the shielding member 170 is located between a bottom of the housing 110 and the motherboard 120, and a width of the shielding member 170 is narrower than the width of the motherboard 120.

Referring to FIG. 1 and FIG. 3 again. In the present embodiment, the electronic apparatus 100 further includes a cover plate 180 disposed at the opening 112 of the housing 110, such that the display module 140 is located between the battery 130 and the cover plate 180. The width of the display module 140 is narrower than a width of the cover plate 180.

Figure 5:
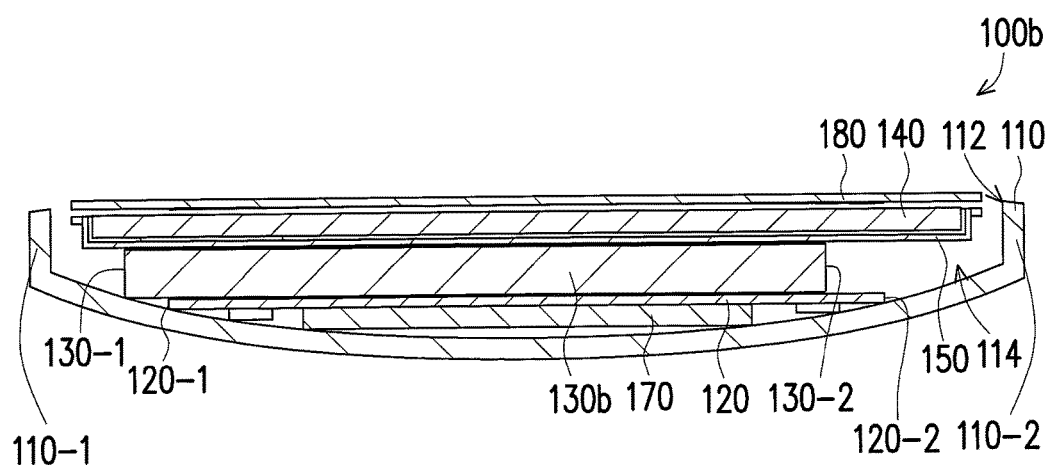
FIG. 5 is an enlarged cross-sectional view of an electronic apparatus according to yet another embodiment of the application.

FIG. 5 is an enlarged cross-sectional view of an electronic apparatus according to yet another embodiment of the application. Referring to FIG. 5. According to an electronic apparatus 100b of the present embodiment, one edge 130-1 of a battery 130b in a width direction of the battery 130b is closer to a corresponding side 110-1 of the housing 110 than a corresponding edge 120-1 of the motherboard 120 in a width direction of the motherboard 120. In addition, one edge 130-2 of the battery 130b in a width direction of the battery 130b is not closer to a corresponding side 110-2 of the housing 110 than a corresponding edge 120-2 of the motherboard 120 in a width direction of the motherboard 120. As a result, according to embodiments of FIG. 3 and FIG. 5, at least one edge of the battery in a width direction of the battery is closer to a corresponding side of the housing than a corresponding edge of the motherboard in a width direction of the motherboard.

Figure 6:
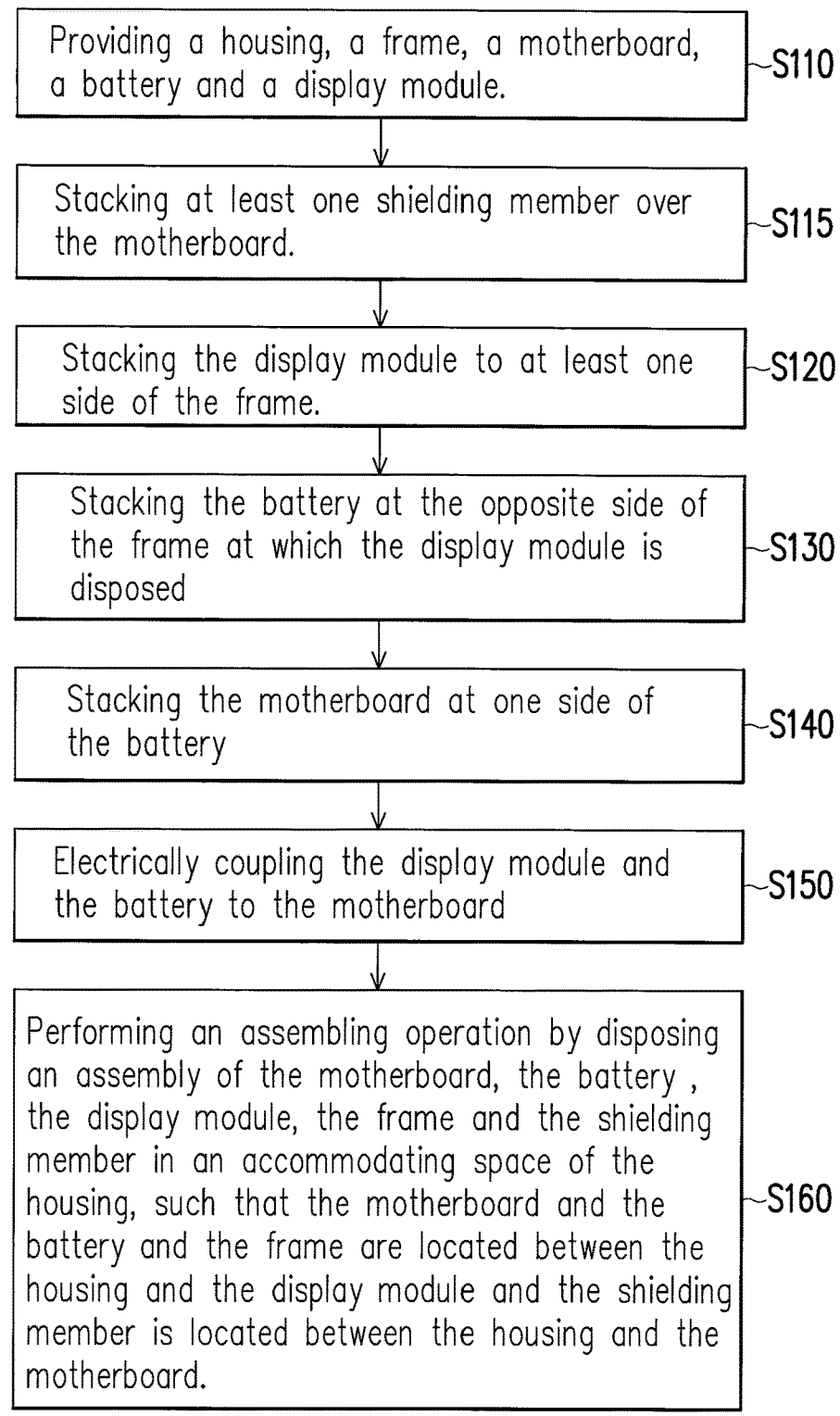
FIG. 6 is a flow chart of a method for assembling an electronic apparatus according to an embodiment of the application.

FIG. 6 is a flow chart of a method for assembling an electronic apparatus according to an embodiment of the application. Referring to FIG. 1 and FIG. 6. In Step S110, the housing 110, the motherboard 120, the battery 130, the display module 140 and the frame 150 are provided, wherein the housing 110 has the opening 112 and the accommodating space 114, the width of the motherboard 120 is narrower than the width of the battery 130, and the width of battery 130 is narrower than the width of the display module 140. In Step S120, the display module 140 is stacked at one side of the frame 150.

In Step S130, the battery 130 is stacked at the opposite side of the frame 150 at which the display module 140 is disposed. In Step S140, the motherboard 120 is stacked at one side of the battery 130. In Step S150, the display module 140 and the battery 130 are electrically coupled to the motherboard 120. In Step S160, an assembling operation is performed, wherein an assembly of the motherboard 120, the battery 130, the display module 140 and the frame 150 are disposed in the accommodating space 114 of the housing 110.

Referring to FIG. 3 and FIG. 6. The present embodiment further includes Step S115. In Step S115, before performing the assembling operation (Step S160), the shielding member 170 is stacked over the motherboard 120, wherein the width of the shielding member 170 is narrower than the width of the motherboard 120. After the assembling operation (Step S160) is performed, the shielding member 170 is also disposed in the accommodating space 114 and located between the housing 110 and the motherboard 120.

Referring to FIG. 3 and FIG. 6. In the present embodiment, a step of electrically coupling the display module 140 to the motherboard 120 in Step S150 includes having the flexible printed circuit board 160 bypassing the battery 130 and connecting the display module 140 and the motherboard 120.

In light of the foregoing, the application presents an appearance of an electronic apparatus as a smooth arc shape, and a stacking method inside a space of the electronic apparatus allows interior components to be disposed in a housing with a design of a curved surface or an inclined plane. Accordingly, the application can effectively utilize an interior space of a housing to increase a capacity of a battery.

Although the application has been described with reference to the above embodiments, it is not intended to limit the application. It will be apparent to people of ordinary skill in the art that modifications and variations to the described embodiments may be made without departing from the spirit and scope of the application. Accordingly, the scope of the application will be defined by the attached claims not by the above detailed descriptions.

What is claimed is:

1. A method for assembling an apparatus, comprising
providing a housing, a motherboard, a battery and a display module, wherein the housing has at least an opening and an accommodating space, and the battery has assembled to the display module;
stacking the mother board to one side of the battery, wherein the motherboard is located between the housing and the battery;
electrically coupling the display module and the battery to the motherboard;
assembling the motherboard, the battery and the display module; and
performing an assembling operation to dispose the assembly of the motherboard, the battery and the display module in the accommodating space of the housing, such that the motherboard and the battery are located between the housing and the display module.

2. The method for assembling the electronic apparatus of claim 1, further comprising:
providing a frame; and
stacking the display module and the battery respectively on two opposite sides of the frame, such that the battery is assembled to the display module through the frame.

3. The method for assembling the electronic apparatus of claim 1, further comprising:
before performing the assembling operation, stacking at least one shielding member over the motherboard, wherein a width of the shielding member is narrower than a width of the motherboard, and after the assembling operation is performed, the shielding member is located between the housing and the motherboard.

4. The method for assembling the electronic apparatus of claim 1, wherein a step of electrically coupling the display module to the motherboard includes:
   having a flexible printed circuit board bypassing the battery and connecting a flexible printed circuit board to the display module and the motherboard.

5. The method for assembling the electronic apparatus of claim 1, wherein a step of performing the assembling operation further comprises:
   leaning one edge of the motherboard in a width direction of the motherboard and a corresponding edge of the battery in a width direction of the battery against a corresponding side of the housing.

6. The method for assembling the electronic apparatus of claim 5, wherein the edge of the motherboard and the edge of the battery lean against a part of the housing.

7. The method for assembling the electronic apparatus of claim 5, wherein one edge of the battery extends beyond one corresponding edge of the motherboard.

8. The method for assembling the electronic apparatus of claim 5, wherein the width of the motherboard is narrower than the width of the battery and the width of the battery is narrower than a width of the display module.

9. A method for assembling an electronic apparatus, comprising:
   providing a housing, a motherboard, a battery and a display module, wherein the housing has at least an opening and an accommodating space, and the battery has assembled to the display module;
   stacking the motherboard to one side of the battery, wherein the motherboard is located between the housing and the battery;
   electrically coupling the display module and the battery to the motherboard;
   assembling the motherboard, the battery and the display module; and
   performing an assembling operation to dispose assembly of the motherboard, the battery and the display module in the accommodating space of the housing, such that he motherboard and the battery are located between the housing and the display module and one edge of the battery extends beyond one corresponding edge of the motherboard.

10. The method for assembling the electronic apparatus of claim 9, further comprising:
    providing a frame; and
    stacking the display module and the battery respectively on two opposite sides of the frame, such that the battery is assembled to the display module through the frame.

11. The method for assembling the electronic apparatus of claim 9, further comprising:
    before performing the assembling operation, stacking at least one shielding member over the motherboard, wherein a width of the shielding member is narrower than a width of the motherboard, and after the assembling operation is performed, the shielding member is located between the housing and the motherboard.

12. The method for assembling the electronic apparatus of claim 9, wherein a step of electrically coupling the display module to the motherboard includes:
    having a flexible printed circuit board bypassing the battery and connecting a flexible printed circuit board to the display module and the motherboard.

13. The method for assembling the electronic apparatus of claim 9, wherein a step of performing the assembling operation further comprises:
    leaning one edge of the motherboard in a width direction of the motherboard and a corresponding edge of the battery in a width direction of the battery against a corresponding side of the housing.

14. A method for assembling an electronic apparatus, comprising:
    providing a housing, a motherboard, a battery and a display module, wherein the housing has at least an opening and an accommodating space, and the battery has assembled to the display module;
    stacking the motherboard to one side of the battery, wherein the motherboard is located between the housing and the battery;
    electrically coupling the display module and the battery to the motherboard;
    assembling the motherboard, the battery and the display module; and
    performing an assembling operation to dispose the assembly of the motherboard, the battery and the display module in the accommodating space of the housing, such that the motherboard and the battery are located between the housing and the display module, and a width of the motherboard is narrower than a width of the battery and a width of the battery is narrower than a width of the display module.

15. The method for assembling the electronic apparatus of claim 14, further comprising:
    providing a frame; and
    stacking the display module and the battery respectively on two opposite sides of the frame, such that the battery is assembled to the display module through the frame.

16. The method for assembling the electronic apparatus of claim 14, further comprising:
    before performing the assembling operation, stacking at least one shielding member over the motherboard, wherein a width of the shielding member is narrower than the width of the motherboard, and after the assembling operation is performed, the shielding member is located between the housing and the motherboard.

17. The method for assembling the electronic apparatus of claim 14, wherein a step of electrically coupling the display module to the motherboard includes:
    having a flexible printed circuit board bypassing the battery and connecting a flexible printed circuit board to the display module and the motherboard.

18. The method for assembling the electronic apparatus of claim 14, wherein a step of performing the assembling operation further comprises:
    leaning one edge of the motherboard in a width direction of the motherboard and a corresponding edge of the battery in a width direction of the battery against a corresponding side of the housing.

* * * * *